(12) United States Patent
Towns et al.

(10) Patent No.: US 6,887,973 B2
(45) Date of Patent: May 3, 2005

(54) ELECTRO-LUMINESCENT POLYMERS, THEIR PREPARATION AND USES

(75) Inventors: Carl Towns, Essex (GB); Richard O'Dell, Taufkirchen (GB); Valerie Grand, Cambridge (GB)

(73) Assignee: Cambridge Display Technology Limited, Cambridgeshire (GB)

(*) Notice: Subject to any disclaimer, the term of this patent is extended or adjusted under 35 U.S.C. 154(b) by 10 days.

(21) Appl. No.: 10/204,919

(22) PCT Filed: Feb. 26, 2001

(86) PCT No.: PCT/GB01/00809

§ 371 (c)(1),
(2), (4) Date: Nov. 12, 2002

(87) PCT Pub. No.: WO01/62822

PCT Pub. Date: Aug. 30, 2001

(65) Prior Publication Data

US 2003/0153725 A1 Aug. 14, 2003

Related U.S. Application Data

(60) Provisional application No. 60/200,209, filed on Apr. 28, 2000.

(30) Foreign Application Priority Data

Feb. 25, 2000 (GB) .............................................. 0004544
Mar. 13, 2000 (WO) .............................. PCT/GB00/00911

(51) Int. Cl.[7] .............................................. C08G 73/00

(52) U.S. Cl. ........................ 528/422; 528/86; 428/690; 428/917

(58) Field of Search .................. 528/422, 86; 428/690, 428/917

(56) References Cited

U.S. PATENT DOCUMENTS

| 5,777,070 A | 7/1998 | Inbasekaran et al. |
| 5,900,327 A | 5/1999 | Yu Gang et al. |

FOREIGN PATENT DOCUMENTS

| EP | 0 953 624 | 11/1999 |
| WO | 00/55927 | 9/2000 |
| WO | 01/05853 | 1/2001 |

OTHER PUBLICATIONS

International Search Report, PCT/GB01/00809; ISA/EPO, May 30, 2001.
Meng, Hong; Yu, Wang–Lin and Huang, Wei; "Facile Synthetic Route to a Novel Electroluminescent Polymer–Poly(p–phenylenevinylene) Containing a Fully Conjugated Aromatic Oxadiazole side Chain", Macromolecules, vol. 32, No. 26, 1999; pp 8841–8847.
Mielke et al; "Fluorenylidene–linked triarylamines as new hole–transporting materials for organic light–emitting diodes (OLEDS)", Polyn. Prepr. (Am. Chem. Soc., Div. Polym. Chem.), 2000, 41(1), 877–878 (CAS Abstract).
Maki, et al.; "Effects of Hole Transport Layers on the Characteristics of Organic Light Emitting Diodes"; Jpn. Soc. Colour Mater (Shikizai), 72(12), 733–738 (1999).
United Kingdom Patent Office Search Report—GB 0004544.3; Oct. 25, 2000.

Primary Examiner—Duc Truong
(74) Attorney, Agent, or Firm—Harness Dickey & Pierce, P.L.C.

(57) ABSTRACT

An organic polymer comprising a conjugated backbone for transporting negative charge carriers and having a first band gap and at least one side unit pendent from the backbone for transporting positive charge carriers and having a second band gap, wherein the structure of the organic polymer is selected so that the first and second band gaps are distinct from one another in the polymer.

24 Claims, 3 Drawing Sheets

ELECTRO-LUMINESCENT POLYMERS, THEIR PREPARATION AND USES

The present invention relates to an organic polymer and uses thereof such as in an optical device, and to a process for preparing such a polymer.

Organic electroluminescent devices are known which employ an organic material for light emission. For example, WO 90/13148 describes such a device comprising a semiconductor layer comprising a polymer film which comprises at least one conjugated polymer situated between electrodes. The polymer film in this case comprises a poly(paraphenylene vinylene) (PPV) film which is capable of light emission when electrons and holes are injected therein. Other polymer layers capable of transporting holes or transporting electrons to the emissive layer may be incorporated into such devices.

For organic semiconductors important characteristics are the binding energies, measured with respect to the vacuum level of the electronic energy levels, particularly the "highest occupied molecular orbital" (HOMO) and "lowest unoccupied molecular orbital" (LUMO) levels. These can be estimated from measurements of photoemission and particularly measurements of the electrochemical potentials for oxidation and reduction. It is well understood in the field that such energies are affected by a number of factors, such as the local environment near an interface, and the point on the curve (peak) from which the value is determined. Accordingly, the use of such values is indicative rather than quantitative.

Figure 1:
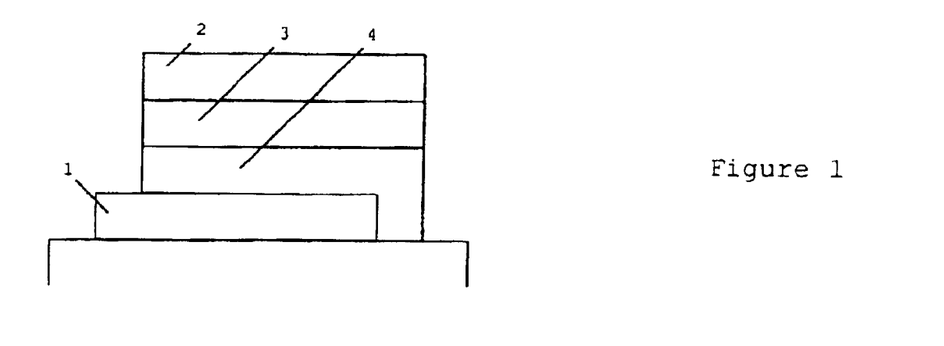
FIG. 1 shows a cross section of a typical device for emitting light.
Figure 2:
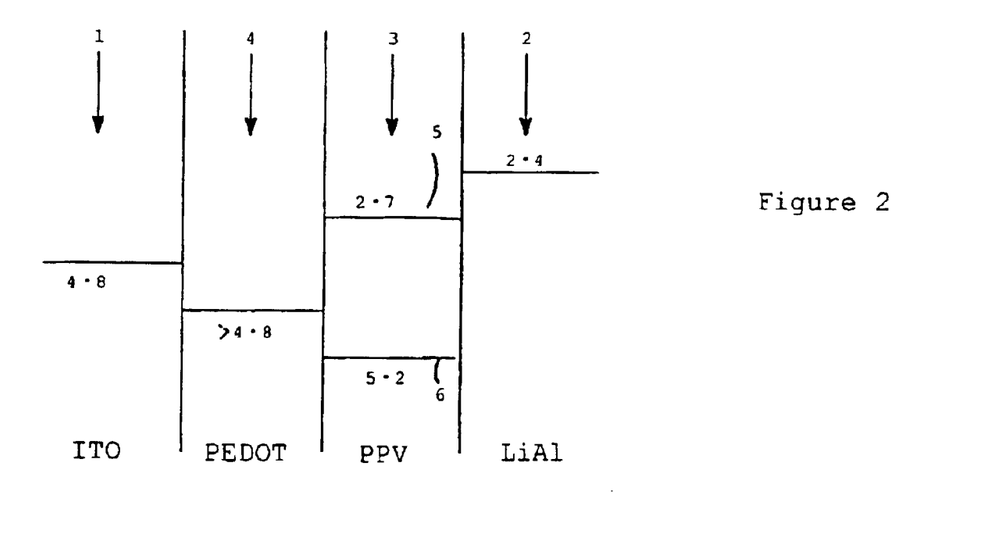
FIG. 2 shows the energy levels across the device of FIG. 1.

FIG. 1 shows a cross section of typical device for emitting light. FIG. 2 shows the energy levels across the device. The anode 1 is a layer of transparent indium-tin oxide (ITO) with a work function of 4.8 electron volts. The cathode 2 is a LiAl layer with a work function of 2.4 electron volts. Between the electrodes is a light emissive layer 3 of PPV, having a LUMO energy level 5 at around 2.7 electron volts and a HOMO energy level 6 at around 5.2 electron volts. Holes and electrons that are injected into the device recombine radiatively in the PPV layer. An important feature of the device is the hole transport layer 4 of polyethylene dioxythiophene (PEDOT). This polymer is disclosed in EP 0686662. This provides an intermediate energy level at about 4.8 electron volts which helps the holes injected from the ITO to reach the HOMO level in the PPV.

It should be noted here that values stated for energy levels, work functions etc. are generally illustrative rather than absolute. For example, the work function of ITO can vary widely. The applicants have carried out Kelvin probe measurements which suggest that 4.8 electron volts is a reasonable value. However, it is well known that the actual value can depend on ITO deposition process and history.

Known device structures also may have an electron transport layer situated between the cathode 2 and the light emissive layer 3. This provides an intermediate energy level which help the electrons injected from the cathode to reach the LUMO level of the material constituting the light emissive layer. Suitably, the electron transporting layer has a LUMO energy level between the LUMO energy levels of the cathode and the light emissive layer.

One disadvantage associated with multiple layered devices is that where the layers are deposited from solution it is difficult to avoid one layer being disrupted when the next is deposited, and problems can arise with voids or material trapped between the increased number of interlayer boundaries.

Appl.Phys.Lett. 51, 913–915 (1987) is concerned with organic thin-film electroluminescence. Devices disclosed in this document consist of a hole-transporting layer of an aromatic diamine and an emissive layer of 8-hydroxiquinoiene aluminium. ITO is used as the hole-injecting electrode and a magnesium-silver alloy as the electron-injecting electrode.

As is disclosed in Nature, 397, 121–128 (1999) TPD is used as a hole transport layer. However, this molecular material has the disadvantages associated with using small molecule layers in a device. Similarly, this document discloses that PBD is known as an electron transport layer. Again, this has the disadvantageous device characteristics associated with using small molecule layers as compared with polymer layers in electroluminescent devices.

The use of polymers in general in light emitting devices, and particularly as charge transport materials is very attractive. Polymers show excellent device characteristics. These device characteristics include good efficiency, processability and device lifetime.

Poly(arylamines) are disclosed in U.S. Pat. No. 5,728,801 as useful charge transport layers in light-emitting diodes. This document further discloses that triarylamines are used as charge transport materials, specifically positive charge transport materials, because they are easily oxidised to the corresponding radical cation. The usefulness of the possibility of using these polymers in film form is discussed in this document.

In view of the above, there still remains a need to simplify the structure of light emitting devices, thus, simplifying manufacturing processes and reducing production costs.

The present invention provides an electroluminescent device comprising: a first charge carrier injecting layer for injecting positive charge carriers; a second charge carrier injecting layer for injecting negative charge carriers; and a light emissive layer located between the charge carrier and injecting layers and comprising a mixture of: a first component for accepting positive charge carriers from the first charge carrier injecting layer; a second component for accepting negative charge carriers from the second charge carrier injecting layer; and a third organic light emissive component for accepting and combining charge carriers from the first and second components to generate light.

Two or more of the components of the emissive layer may be provided as functional chemical units or moieties of a single molecule. Any further components of the layer may be provided by one or more further molecules physically mixed with the said single molecule. Where a single molecule provides more than one component those components could be combined as a copolymer (e.g. in main chain, side chain, block or random form). One or more of the components could be provided as a pendant group of a polymer chain of another one or more of the components.

According to a first aspect of the present invention there is provided an organic polymer comprising: a conjugated backbone for transporting negative charge carriers and having a first bandgap; and at least one side unit pendent from the backbone for transporting positive charge carriers and having a second bandgap, wherein the structure of the organic polymer is selected so that the first and second bandgaps are distinct from one another in the polymer.

The organic polymer provided by the present invention solves the problems of the prior art by reducing the total number of layers and polymer components required in a light-emitting device. Instead of requiring two separate polymers; one to act as a negative charge transport material and a second to act as a positive charge transport material, the present polymer is capable as acting as both. This reduces the number of layers required in a light-emitting device. In the case where the components of several different layers having different functions are blended, this reduces the number of components needed in the blend.

In one preferred aspect of the present invention, the conjugated backbone comprises a substituted or unsubstituted fluorene or phenylene group.

In a further aspect of the present invention, the conjugated backbone comprises a carbon or nitrogen bridging group. In the case where the conjugated backbone comprises a substituted or unsubstituted fluorene group, the side unit preferably is attached to the conjugated backbone via a carbon bridging group which is C9 of the fluorene group.

A preferred side unit in accordance with the present invention is a side unit comprising a substituted or unsubstituted triarylamine group. As mentioned above, the low oxidation potential of triarylamines makes them particularly suitable as positive charge transport materials.

In a preferred aspect of the present invention, the organic polymer has a repeat unit comprising:

I wherein one or both of R and R' comprise the at least one side unit and R and $R_1$ are the same or different.

In one embodiment of the present invention, the repeat unit comprises:

II wherein Ar is a substituted or unsubstituted aromatic or heteroaromatic group. Preferably, Ar comprises a substituted or unsubstituted fluorene group. More preferably, Ar comprises dioctyl fluorene.

The ability to select Ar is an important feature, particularly in the design of electroluminescent devices. The structure of Ar may be selected to improve efficiency of a device by modulating the LUMO level of the conjugated backbone to help electron injection from the cathode to the light emissive material.

Suitable Ar groups may comprise a repeat unit as disclosed in International patent publication No. WO 00/55927. Specifically, preferred Ar groups may comprise a repeat unit selected from:

X and Y may be the same or different and are substituent groups. V and VI, A, B, C and D may be the same or different and are substituent groups. It is preferred that one or more of X, Y, A, B, C and D is independently selected from the group consisting of alkyl, aryl, perfluoroalkyl, thioalkyl, cyano, alkoxy, heteroaryl, alkylaryl and arylalkyl groups. One or more of X, Y, A, B, C and D also may be hydrogen. It is preferred that one or more of X, Y, A, B, C and D is independently an unsubstituted, isobutyl group, an n-alkyl, an n-alkoxy or a trifluoromethyl group because they are suitable for helping to select the HOMO level and/or for improving solubility of the polymer.

wherein $R_3$ and $R_4$ are the same or different and are each independently a substituent group. Preferably, $R_3$ or $R_4$ may be selected from hydrogen, alkyl, aryl, perfluoroalkyl, thioalkyl, cyano, alkoxy, heteroaryl, alkylaryl, or arylalkyl. These groups are preferred for the same reasons as discussed in relation to X, A, B, C and D above. Preferably, for practical reasons, R₃ and R₄ are the same. More preferably, they are the same and are each a phenyl group.

In a preferred aspect of the present invention, one or both of R and R' comprises a substituted or unsubstituted triarylamine unit.

Preferably the substituted or unsubstituted triarylamine unit comprises:

III wherein X and Y are substituents which do not substantially affect the overall function of the polymer and are the same or different. The applicants have found preferable ranges of n, m and p to be 1≦n≦6, 1≦m≦6 and 1≦p≦6.

Optionally, the side unit in a polymer according to the present invention is attached to the backbone via spacer group. In particular, the spacer group may be a C1–C10 alkyl group.

Alternatively, the side unit may be attached directly to the conjugated backbone, without the presence of a spacer group. Where the side unit comprises a substituted or unsubstituted triarylamine unit, it is preferred that the triarylamine unit is attached directly to the conjugated backbone. Where the conjugated backbone comprises a carbon or nitrogen bridging group, it is preferred that the triarylamine unit is attached directly the bridging group.

In a further preferred aspect according to the present invention, the organic polymer has a repeat unit comprising:

IV wherein X, Y, n, m and p are as defined above and X' and Y' are substituents and are the same or different. Again, the applicants have found that preferred values for n', m' and p' are 1≦n'≦6, 1≦m'≦6 and 1≦p'≦6.

X, Y, X' and Y' and n, n', m, m', p, and p' may be selected advantageously to modify the HOMO level of the at least one side unit so as to help hole injection from the anode to the emissive material. For this purpose, the applicants have found that, preferably, one or more of X, X', Y or Y' independently comprises hydrogen, an alkyl group, an alkoxy group, a halide group, a cyano group, a heteroaryl, alkylaryl or an arylalkyl group, particularly a trifluoromethyl group, a thioaikyl group or a substituted or unsubstituted triarylamine unit. It is particularly preferred that X and Y are the same and are each hydrogen or an alkyl group and X' and Y' are the same and are each hydrogen or an alkyl group.

Optionally, the present polymer is soluble. The structure of the side unit and, in particular X, Y, X' and Y' may be selected to confer on the polymer solubility in a particular solvent system, for example for depositing the polymer on a substrate. Typical solvents include common organic for depositing the polymer on a substrate. Typical solvents include common organic solvents, for example, THF, toluene, xylene and organic ink jet ink formulations.

Without being limited to the above preferred groups for X, X', Y and Y', it is preferred that the present organic polymer has a repeat unit comprising:

V

The positions of the substituent X, X', Y and Y' groups shown in Formulas III, IV and V above are preferred positions only. It should be understood that the substituents may be provided at any suitable position where the substituent does not substantially affect the overall function of the polymer (i.e. that it comprises a conjugated backbone for transporting negative charge carriers and at least one side unit pendent from the backbone for transporting positive charge carriers).

Broadly speaking, polymers according to the present invention include branched and linear polymers, homopolymers, copolymers, terpolymers and higher order polymers. It is envisaged that homopolymers in accordance with the present invention will be of particular interest with regard to their use in light emitting devices. In this regard, it should be noted that a hompolymer (i.e. prepared by polymerisation of a single type of monomer) may be defined to have more than one different repeat unit.

Where the polymer according to the present invention is a copolymer or higher order polymer, suitable comonomers will include those comprising Ar as referred to above in relation to formula II.

Preferably, the degree of polymerisation of a polymer according to the present invention is at least 3.

In the first aspect of the present invention, there is provided also a film or coating comprising a polymer according to this invention.

It is envisaged also that a polymer according to the present invention may be used for accepting and combining positive and negative charge carriers in a device to generate light.

In a second aspect of the present invention, there is provided use of an organic polymer according to the present invention in an optical device such as a luminescent device, preferably an electroluminescent device. Other devices include photoluminescent devices, photovoltaic devices and waveguides. Other uses include the use of the polymer in a dye composition, in a fibre or in a sensor. Typically, the organic polymer is positioned so that it is capable of acting as a charge transport material either in a charge transport layer or as part of a blended light emissive layer.

In a third aspect according to the present invention, there is further provided an optical device comprising a first charge carrier injecting layer for injecting positive charge carriers, a second charge carrier injecting layer for injecting negative charge carriers and a light emissive layer located between the charge carrier injecting layers and comprising an organic component for accepting and combining positive and negative charge carriers to generate light and an organic polymer in accordance with the present invention.

The organic component and organic polymer may be blended together in a mixture. The mixture may be homogeneous or phase separated.

Accordingly, the present invention also provides a composition comprising a blend or mixture comprising at least one polymer according to the present invention. Preferably, the blend comprises at least two or three different polymers.

Alternatively, the light emissive layer may comprise a layer of the organic component and one or more layers of an organic polymer in accordance with the present invention.

Further hole transport layers could be added to the above-described general device structure so as to provide a series of intermediate energy steps between the anode and the emissive layer. Suitably, the hole transporting layer has a HOMO energy level between the HOMO energy levels of the anode and the present organic polymer.

It would be known to a person skilled in the art how to make repeat unit monomers in accordance with the present invention.

According to a fourth aspect of the present invention there is provided a compound having general formula VI:

E—repeat unit—E'  VI for use in a polymerisation reaction for the preparation of a polymer, particularly a polymer according to this invention. Also provided is the use of the above compound for the preparation of a polymer for transporting holes and electrons in an optical device. The repeat unit in this compound is as defined above. E and E' are the same or different and are reactive groups capable of undergoing chain extension. Typically, E and E' are the same or different and are selected from the group consisting of a reactive halide functional group and a reactive boron derivative group. Preferably, the reactive halide functional group is selected from the group consisting of F, Cl, Br and I and the boron derivative group is selected from the group consisting of a boronic acid group, a boronic ester group and a borane group.

Several different polymerisation methods are known which may be used to manufacture polymers in accordance with the present invention.

One suitable method is disclosed in International patent publication No. WO 00/53656, the contents of which are incorporated herein by reference. This describes the process for preparing a conjugated polymer, which comprises polymerising in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide function group and one reactive boron derivative group selected from a boronic acid group, a boronic ester group and a borane group, wherein the reaction mixture comprises a catalytic amount of a catalyst (e.g palladium), and an organic base in an amount sufficient to convert the reactive boron derivative groups into —B(OH)$_3$ anions.

Polymers according to the present invention which have been produced by this method are particularly advantageous. This is because reaction times are short and residual catalyst (e.g. palladium) levels are low.

Another polymerisation method is disclosed in U.S. Pat. No. 5,777,070. Commonly, this process is known as "Suzuki Polymerisation". The process involves contacting monomers having two reactive groups selected from boronic acid, C1–C6 boronic acid ester, C1–C6 borane and combinations thereof with aromatic dihalide functional monomers or monomers having one reactive boronic acid, boronic acid, boranic acid ester or boring group and one reactive halide functional group with each other.

A further polymerisation method is known from "Macromolecules", 31, 1099–1103 (1998). The polymerisation reaction involves nickel-mediated coupling of dibromide monomers. This method commonly is known as "Yamamoto Polymerisation".

The present application now will be described in further detail with reference to the accompanying drawings in which.

Figure 3:
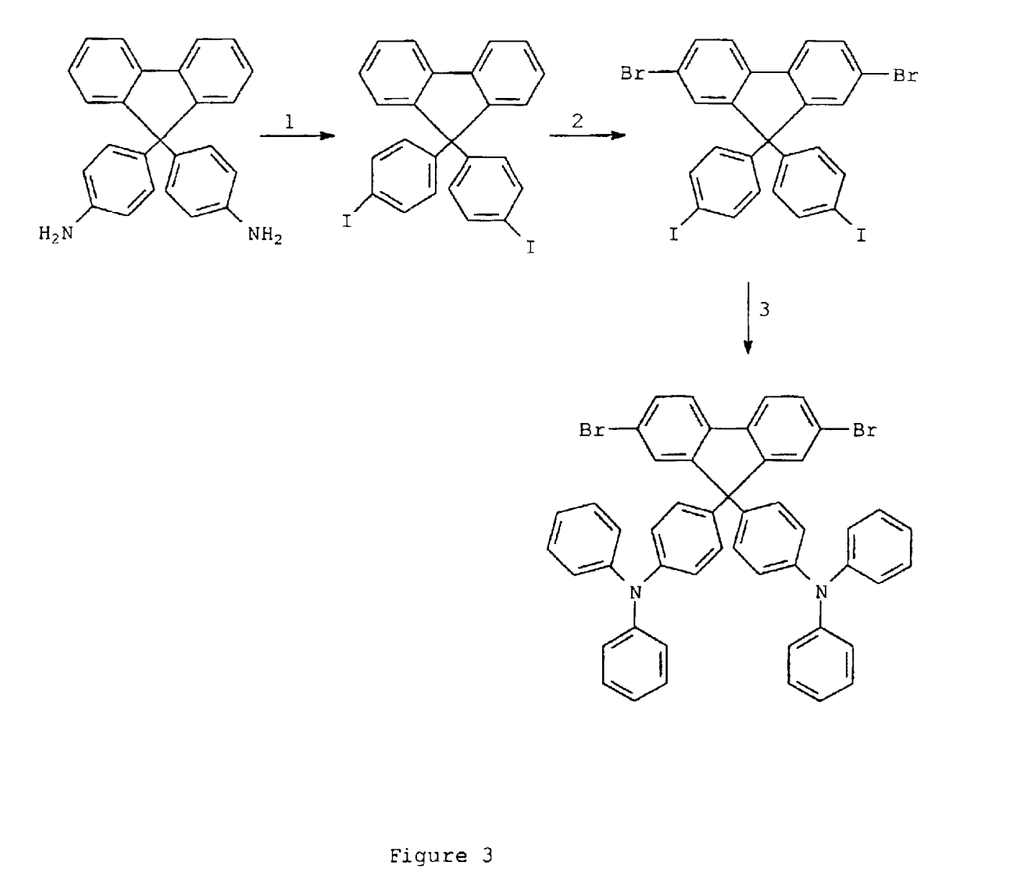
FIGS. 3 and 4 show suitable reaction schemes for making a monomer suitable for making a polymer in accordance with the present invention.
Figure 4:
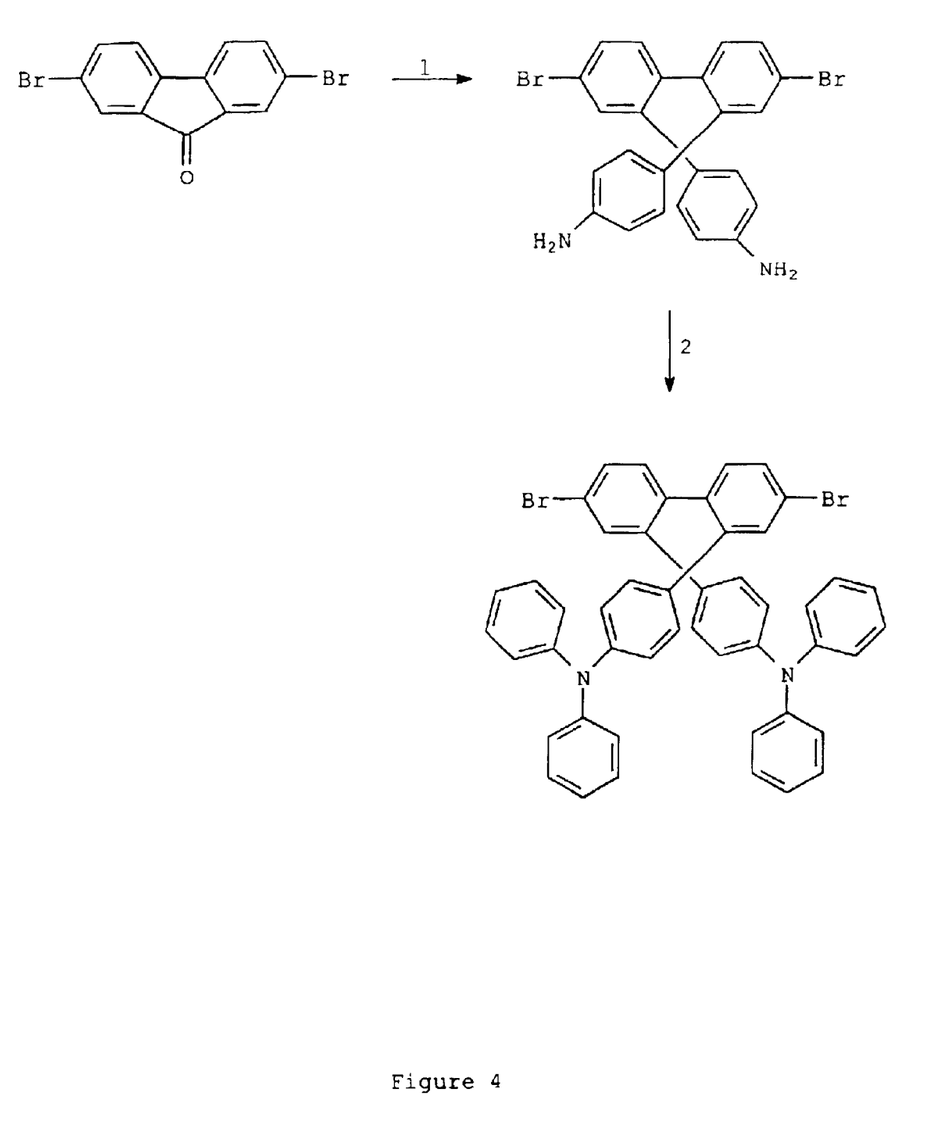

One particular monomer suitable for making a polymer in accordance with the present invention can be synthesised in accordance with the reaction scheme shown in FIG. 3 or FIG. 4. In FIG. 3, step 1 is a Sandmeyer reaction, step 2 is a bromination reaction, and step 3 is a modified Ullmann reaction. The resultant monomer product is about 85% pure and shows a good NMR spectrum. In FIG. 4, step 1 is a reaction with aniline, and step 2 is a reaction with iodobenzene, followed by the modified Ullmann reaction to discriminate between iodide and bromide.

EXAMPLE 1

Preparation of DiBrPDAF Phenylated Dianilinefluorene-dibromide

Methanesulfonic acid (3.2 mL, 49.3 mmol) was added dropwise to aniline (15 mL, 164.6 mmol). The solid mixture was heated to 180° C. for one hour then cooled to room temperature overnight. Heating was resumed at 180° C. for 30 min then 2,7-dibromofluorenone (5.00 g, 14.79 mmol) was added portionwise. The temperature was increased to 185° C. and heating maintained for a further 22 hours.

The purple solid was treated with toluene and 10% sodium hydroxide until pH 14. The aqueous phase was removed and the toluene layer was washed with saturated sodium chloride, dried over MgSO$_4$, filtered and evaporated.

$^1$H NMR (CDCl$_3$) 7.53 (2H, d, J 8.0), 7.45 (2H, d, J 1.2), 7.43 (2H, dd, J 1.6, 8.0), 6.92 (4H, d AB, J 8.4), 6.54 (4H, d AB, J 8.4), 3.60 (4H, NH$_2$); $^{13}$C NMR (CDCl$_3$) 154.3, 145.5, 138.1, 134.6, 130.7, 129.5, 129.1, 121.9, 121.6, 115.2, 64.6. GC-MS (m/z, relative intensity %) 506 (M$^+$, 100).

A flask was charged with 1,10-phenanthroline (0.1983 g, 1.10 mmol), copper(I) chloride (0.1091 g, 1.10 mmol), 40 mL of toluene, dibromodianiline fluorene (5.559 g, 10.98 mmol), iodobenzene (14.8 mL, 132.7 mmol), potassium hydroxide finely powdered (3.090 g, 55.07 mmol) and further 40 mL of toluene. The mixture was heated to 160° C. for 26 hours. After cooled down to room temperature a further 0.200 g of 1,10-phenanthroline and 0.110 g of copper(I) chloride was added and heating was resumed at 160° C. for 5 hours. The reaction mixture was cooled down to room temperature then filtered through celite and the solvent removed.

$^1$H NMR (CDCl$_3$) 7.55 (2H, d, J 8.0), 7.52 (2H, t, J 1.6), 7.45 (2H, dd, J 2.0, 8.0), 7.21 (8H, t, J 8.0), 7.06 (8H, d, J 7.6), 6.98 (4H, t, J 7.2), 6.98 (4H, d AB, J 9.2), 6.90 (4H, d AB, J 9.2); $^{13}$C NMR (CDCl$_3$) 153.7, 147.7, 147.0, 138.2, 137.9, 131.0, 129.6, 129.4, 128.9, 124.9, 123.3, 123.0, 122.0, 121.7, 64.9.

What is claimed is:

1. An organic polymer comprising:
  a conjugated backbone for transporting negative charge carriers and having a first band gap; and
  at least one side unit pendant from the backbone for transporting positive charge carriers and having a second band gap,
  wherein the structure of the organic polymer is selected so that the first and second band gaps are distinct from one another in the polymer.

2. An organic polymer according to claim 1, wherein the conjugated backbone comprises a substituted or unsubstituted fluorene or phenylene.

3. An organic polymer according to claim 2, wherein the conjugated backbone comprises a carbon or nitrogen bridging group.

4. An organic polymer according to claim 1, wherein the at least one side unit comprises a substituted or unsubstituted triarylamine group.

5. An organic polymer according to claim 2, which polymer has a repeat unit comprising:

(I)

wherein one or both of R and R$^1$ comprise the at least one side unit and R and R$^1$ are the same or different.

6. An organic polymer according to claim 5, wherein the repeat unit comprises:

(II)

where Ar is a substituted or unsubstituted aromatic or heteromatic group.

7. An organic polymer according to claim 6, wherein Ar comprises dioctyl fluorene.

8. An organic polymer according to claim 2, wherein one or both of R and R$^1$ comprises a substituted or unsubstituted triarylamine unit.

9. An organic polymer according to claim 8, wherein the substituted or unsubstituted triarylamine unit comprises:

(III)

wherein X and Y are substituents and are the same or different and $1 \leq n \leq 6$ and $1 \leq p \leq 6$.

10. An organic polymer, according to claim 1, wherein the side unit is attached to the backbone via a C1–C10 alkyl group.

11. An organic polymer according to claim 8, wherein the substituted triarylamine unit is attached directly to a bridging group.

12. An organic polymer according to claim 5, wherein R and R$^1$ are the same.

13. An organic polymer according to claim 5, wherein R and R$^1$ both comprise a substituted or unsubstituted triarylamine unit.

14. An organic polymer according to claim 9, which polymer has a repeat unit comprising:

(IV)

wherein X' and Y' are substituents and are the same or different and $1 \leq n' \leq 6$, $1 \leq m' \leq 6$, and $1 \leq p' \leq 6$.

15. An organic polymer according to claim 14, wherein one or more of X, X', Y, or Y' independently comprises hydrogen, an alkyl group, a halide group, a cyano group, a trifluoromethyl group or a substituted or unsubstituted triarylamine unit.

16. An organic polymer according to claim 14, wherein X and Y are the same and are each hydrogen or an alkyl group and X' and Y' are the same and are each hydrogen or an alkyl group.

17. An organic polymer according to claim 14, which polymer has a repeat unit comprising:

(V)

where one or more of X, X', Y and Y' independently comprises hydrogen, an alkyl group, a halide group, a cyano group, a trifluoromethyl group or a substitiuted or unsbstituted triarylamine unit.

18. An organic according to claim 1 comprising a homopolymer.

19. An organic polymer according to claim 1 for use in an optical device.

20. An organic polymer according to claim 19, wherein the optical device comprises an electroluminescent device.

21. An organic polymer according to claim 1 for use in an electroluminescent device.

22. An optical device comprising:

a first charge carrier injecting layer for injecting positive charge carriers;

a second charge carrier injecting layer for injecting negative charge carriers;

a light emissive layer located between the charge carrier injecting layers and comprising an organic component for accepting and combining positive and negative charge carriers to generate light;

a conjugated backbone for transporting negative charge carriers and having a first band gap; and at least one side unit pendant from the backbone for transporting positive charge carriers and having a second band gap, wherein the structure of the organic polymer is selected so that the first and second band gaps are distinct from one another in the polymer.

23. An optical device according to claim 22, wherein the organic polymer and the organic component are blended.

24. An optical device according to claim 22, wherein the light emissive layer comprises an organic component layer and one or more organic polymer layers.

* * * * *